(12) United States Patent
Sung et al.

(10) Patent No.: US 12,107,202 B2
(45) Date of Patent: Oct. 1, 2024

(54) ELECTRONIC DEVICE AND MANUFACTURING METHOD THEREOF

(71) Applicant: Au Optronics Corporation, Hsinchu (TW)

(72) Inventors: Hsin-Hung Sung, Hsinchu (TW); Yi-Wei Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 456 days.

(21) Appl. No.: 17/371,069

(22) Filed: Jul. 8, 2021

(65) Prior Publication Data
US 2022/0254968 A1 Aug. 11, 2022

(30) Foreign Application Priority Data
Feb. 8, 2021 (TW) .................... 110104722

(51) Int. Cl.
*H01L 33/62* (2010.01)
*H01L 33/00* (2010.01)

(52) U.S. Cl.
CPC ............ *H01L 33/62* (2013.01); *H01L 33/005* (2013.01); *H01L 2933/0066* (2013.01)

(58) Field of Classification Search
CPC .............. H01L 33/62; H01L 33/005; H01L 2933/0066; H01L 27/124; H01L 25/167; H01L 23/49811; H01L 21/4846; H01L 23/49838
See application file for complete search history.

(56) References Cited

U.S. PATENT DOCUMENTS

| | | | |
|---|---|---|---|
| 8,994,042 B2 | 3/2015 | Kang et al. | |
| 9,123,593 B2 | 9/2015 | Kang et al. | |
| 9,366,929 B2 | 6/2016 | Kang et al. | |
| 9,632,381 B2 | 4/2017 | Kang et al. | |
| 2014/0339574 A1 | 11/2014 | Kang et al. | |

(Continued)

FOREIGN PATENT DOCUMENTS

| | | |
|---|---|---|
| CN | 104181734 | 12/2014 |
| CN | 110061028 | 7/2019 |

(Continued)

OTHER PUBLICATIONS

"Office Action of Indian Counterpart Application", issued on Oct. 10, 2022, p. 1-p. 5.

*Primary Examiner* — Ratisha Mehta
(74) *Attorney, Agent, or Firm* — JCIPRNET

(57) ABSTRACT

An electronic device, including an active device substrate, an insulation film, a vertical wire, and an anisotropic conductive adhesive, is provided. The active device substrate includes a substrate, a first wire, and a second wire. The first wire is configured on a first surface of the substrate, the second wire is configured on a second surface of the substrate, and a side surface connects the first surface to the second surface that is opposite to the first surface. The insulation film is configured on the side surface of the substrate. The vertical wire is configured on a surface of the insulation film and is located between the insulation film and the side surface of the substrate. The anisotropic conductive adhesive is configured between the vertical wire and the side surface of the substrate and electrically connects the vertical wire to the first wire and the second wire.

9 Claims, 13 Drawing Sheets

(56) References Cited

U.S. PATENT DOCUMENTS

| | | | |
|---|---|---|---|
| 2015/0179670 A1 | 6/2015 | Kang et al. | |
| 2015/0323848 A1 | 11/2015 | Kang et al. | |
| 2016/0306248 A1 | 10/2016 | Kang et al. | |
| 2018/0174952 A1 | 6/2018 | Kim et al. | |
| 2019/0278123 A1 | 9/2019 | Lee | |
| 2020/0212160 A1* | 7/2020 | Jeong | G02F 1/13458 |
| 2020/0292864 A1* | 9/2020 | Kim | H05K 1/147 |
| 2021/0202630 A1* | 7/2021 | Jeon | H10K 59/18 |
| 2022/0320056 A1* | 10/2022 | Liang | H01L 33/486 |

FOREIGN PATENT DOCUMENTS

| | | |
|---|---|---|
| CN | 110568671 | 12/2019 |
| TW | 200839356 | 10/2008 |

* cited by examiner

ELECTRONIC DEVICE AND MANUFACTURING METHOD THEREOF

CROSS-REFERENCE TO RELATED APPLICATION

This application claims the priority benefit of Taiwan application serial no. 110104722, filed on Feb. 8, 2021. The entirety of the abovementioned patent application is hereby incorporated by reference herein and made a part of this specification.

BACKGROUND

Technical Field

The disclosure relates to a device, and in particular to an electronic device and a manufacturing method thereof.

Description of Related Art

With various application requirements, the design of electronic devices has increasingly been changing. For example, in some designs, in order to prevent a size of a product display screen from being limited by a structure of the device itself, there have been designs that splice multiple devices with display functions to achieve the required size. In the design of splicing multiple devices, in order to reduce the presence of splicing seams, these devices need to reduce a frame width as much as possible.

SUMMARY

The disclosure provides an electronic device, which may have a reduced frame width.

The disclosure provides a manufacturing method of an electronic device, which may manufacture an electronic device with a narrow frame.

An electronic device of the disclosure includes an active device substrate, an insulation film, a vertical wire, and an anisotropic conductive adhesive. The active device substrate includes a substrate, a first wire, and a second wire. The first wire is configured on a first surface of the substrate, the second wire is configured on a second surface of the substrate, and the first surface and the second surface are opposite to each other while a side surface connects the first surface to the second surface. The insulation film is configured on the side surface of the substrate. The vertical wire is configured on a surface of the insulation film and located between the insulation film and the side surface of the substrate. The anisotropic conductive adhesive is configured between the vertical wire and the side surface of the substrate and electrically connects the vertical wire to the first wire and the second wire.

In an embodiment of the disclosure, the insulation film has a protrusion portion. The protrusion portion protrudes away from the vertical wire from an end of the vertical wire. The protrusion portion may be bent to cover the end of the vertical wire.

In an embodiment of the disclosure, the electronic device further includes a sealing material. The sealing material is configured on the active device substrate and disposed along at least a part of a periphery of the insulation film. One of the protrusion portion and the sealing material covers the end of the vertical wire.

In an embodiment of the disclosure, the active device substrate further includes a planarization layer. The planarization layer is configured on the substrate. The first wire is located between the planarization layer and the substrate, and an edge of the planarization layer is separated from a side surface by a lateral distance.

In an embodiment of the disclosure, an end of the first wire is aligned with the side surface.

In an embodiment of the disclosure, an end of the second wire is aligned with the side surface.

In an embodiment of the disclosure, the anisotropic conductive adhesive is in contact with an end of the first wire and an end of the second wire.

A manufacturing method of an electronic device of the disclosure includes the following steps. A vertical wire is formed on a first part of an initial film, and the initial film is attached to an initial substrate. A first wire is formed on a first surface of the initial substrate, and a second part of the initial film covers the first wire. A second wire is formed on a second surface of the substrate, in which the first surface and the second surface are opposite to each other. An excess part of the initial substrate attached to the first part of the initial film is removed to form an active device substrate, while concurrently exposing the vertical wire and exposing an end of the first wire and an end of the second wire. The first part of the initial film is attached to the active device substrate through an anisotropic conductive adhesive, so that the anisotropic conductive adhesive is in contact with the first wire, the second wire and the vertical wire.

In an embodiment of the disclosure, the second part of the initial film is removed to leave the first part of the initial film to serve as an insulation film attached to the active device substrate. A sealing material may be further disposed along at least a part of a periphery of the insulation film. The insulation film may be further bent to cover an end of the vertical wire.

In an embodiment of the disclosure, the initial film is attached to the initial substrate through an adhesive.

In an embodiment of the disclosure, the step of removing the excess part of the initial substrate includes cutting the initial substrate and removing the excess part of the initial substrate to form the active device substrate. The initial film and the vertical wire remain intact when the initial substrate is cut.

In an embodiment of the disclosure, the initial film is attached to the initial substrate in a manner of displacing the vertical wire by a lateral distance relative to the first wire.

In an embodiment of the disclosure, the first part of the initial film is attached to the active device substrate through the anisotropic conductive adhesive in a manner of aligning the vertical wire with the first wire and the second wire.

In an embodiment of the disclosure, the anisotropic conductive adhesive is in contact with a part of the insulation film that is not disposed with the vertical wire.

In an embodiment of the disclosure, a length of the vertical wire is not less than a distance from the first wire to the second wire.

Based on the above description, the electronic device according to the embodiment of the disclosure includes the vertical wire disposed on the side surface of the active device substrate, and the vertical wire is used to connect the wires on the upper and lower surfaces (for example, the aforementioned first surface and second surface) of the active device substrate to achieve the design of double-sided circuit conduction. In some embodiments, the vertical wire is pre-fabricated on the insulation film, and the insulation film may be attached to the side surface of the active device substrate through the anisotropic conductive adhesive. When components are fabricated on the second surface of the active device substrate, the insulation film preformed with the vertical wire may be used as a protective layer of the first surface to prevent the components on the first surface from being damaged, thereby improving a manufacturing yield.

To make the abovementioned more comprehensible, several embodiments accompanied by drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
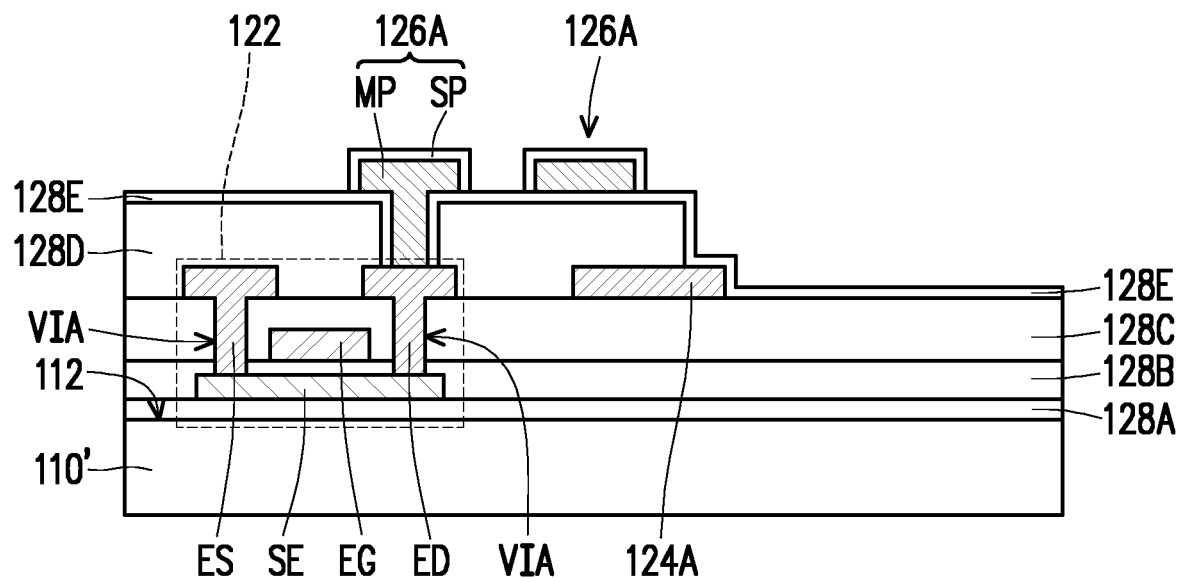
FIGS. 1 to 9 illustrate a manufacturing method an electronic device according to some embodiments.
Figure 1:
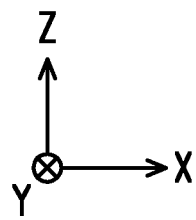

In the drawings, thicknesses of layers, films, panels, regions, etc., are exaggerated for clarity. Throughout the specification, the same reference numerals denote the same elements. It should be noted that when an element of a layer, a film, a region, or a substrate is referred to as being "on" or "connected", "overlapped" to another element, the element may be directly on or connected to the other element, or an intermediate element may exist. In contrast, when an element is referred to as being "directly on" or "directly connected to" another element, no intermediate element exists. As used herein, "connection" may refer to physical and/or electrical connection. Furthermore, "electrical connection" or "coupling" means that there may be other components between two components.

It should be noted that although the terms "first", "second", "third", etc. may be used for describing various elements, components, regions, layers and/or portions, the elements, components, regions, layers and/or portions are not limited by these terms. These terms are only used for separating one element, component, region, layer or portion from another element, component, region, layer or portion. Therefore, the following discussed "first element", "component", "region", "layer" or "portion" may be referred to as the second element, component, region, layer or portion without departing from the scope of the disclosure.

The terminology used herein is for the purpose of describing particular embodiments and is not intended to be limiting of the disclosure. As used herein, the singular forms "a", "an", and "the" are intended to include the plural forms as well, unless the context clearly indicates otherwise. "or" represents "and/or". The term "and/or" used herein includes any or a combination of one or more of the associated listed items. It will be further understood that the terms "comprises", "comprising", "includes", and/or "including", when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "under" or "bottom" and "above" or "top" may be used for describing a relationship of one element and another element as that shown in figures. It should be noted that the relative terms are intended to include a different orientation of the device besides the orientation shown in the figure. For example, if a device in a figure is flipped over, the element originally described to be located "under" other element is oriented to be located "above" the other element. Therefore, the illustrative term "under" may include orientations of "under" and "on", which is determined by the specific orientation of the figure. Similarly, if a device in a figure is flipped over, the element originally described to be located "below" or "underneath" other element is oriented to be located "on" the other element. Therefore, the illustrative term "under" or "below" may include orientations of "above" and "under".

The terms "about", "substantial" or "approximate" used herein include the related value and an average within an acceptable deviation range for a specific value determined by those skilled in the art, considering a discussed measurement and a specific number of errors related to the measurement (i.e. a limitation of a measuring system). For example, "about" may represent a range within one or multiple standard deviations of the related value, or within ±30%, ±20%, ±10%, ±5%. Moreover, the "about", "substantially", or "approximate" used herein may be a more acceptable deviation range or standard deviation based on optical properties, etching properties, or other properties, and not one standard deviation may be applied to all properties.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The exemplary embodiment is described below with reference of a cross-sectional view of a schematic diagram of an idealized embodiment. Therefore, a shape change of the figure serving as a result of manufacturing techniques and/or tolerances may be expected. Therefore, the embodiment of the disclosure should not be construed as limited to a particular shape of a region as shown herein, but includes a shape deviation caused by manufacturing tolerance. For example, a shown or described flat area may generally have rough and/or non-linear features. Moreover, a shown acute angle may be round. Therefore, a region shown in the figure is essentially schematic, and a shape thereof is not intended to show an accurate shape of the region, and is not intended to limit a range of the claims of the disclosure.

FIGS. 19 illustrate a manufacturing method an electronic device according to some embodiments. FIG. 1 illustrates an initial substrate 110' and an active device 122, a first wire 124A, a device bonding pad 126A, and multilayer insulation layers 128A to 128E formed on a first surface 112 of the initial substrate 110'. In some embodiments, the components formed on the first surface 112 may further include signal lines, capacitor structures, optical film layers, and/or other components. The components formed on the first surface 112 of the initial substrate 110' may be used to construct a required circuit to provide functions such as driving control and signal transmission. For the convenience of description, an X-axis, a Y-axis and a Z-axis are indicated in the drawings to represent an orientation of each component and device.

The active device 122 may include a semiconductor layer SE, a gate electrode EG a source electrode ES, and a drain electrode ED, and is a device with a switching function. The semiconductor layer SE may be configured on the insulation layer 128A, and the insulation layer 128A sandwiched between the initial substrate 110' and the semiconductor layer SE may be used to provide a buffer effect to reduce a stress accumulation on the initial substrate 110' or the semiconductor layer SE during the process of forming the semiconductor layer SE. A material of the semiconductor layer SE may include silicon semiconductor (for example, amorphous silicon, polycrystalline silicon, crystalline silicon, etc.), oxide semiconductor, ceramic semiconductor, or other materials that have semiconductor characteristics and may be fabricated on the initial substrate 110' in the form of a film layer. The insulation layer 128B is configured on the semiconductor layer SE and covers the semiconductor layer SE.

The gate electrode EG is configured on the insulation layer 128B, and an orthogonal projection of the gate electrode EG on the initial substrate 110' falls within an orthogonal projection of the semiconductor layer SE on the initial substrate 110'. The insulation layer 128B is sandwiched between the gate electrode EG and the semiconductor layer SE to provide a function of a gate insulation layer. The insulation layer 128C is configured on the gate electrode EG and covers the gate electrode EG The source electrode ES and the drain electrode ED are configured on the insulation layer 128C, and may be filled into a via VIA penetrating through the insulation layers 128A to 128C to be in contact with the semiconductor layer SE. The source electrode ES and the drain electrode ED are separated from each other and are located on different sides of the gate electrode EG The gate electrode EG, the source electrode ES, and the drain electrode ED may be made of a metal material with good conductivity or a multilayer stack of metal materials. In some embodiments, the material of the gate electrode EG, the source electrode ES, and the drain electrode ED may include a non-metallic conductive material (for example, an oxide conductive material, an organic conductive material), but the disclosure is not limited thereto.

In some embodiments, the same film layer as the gate electrode EG may also include signal lines (such as a scan line, a common line), a capacitor electrode, a conductive pad and other components. The same film layer as the source electrode ES and the drain electrode ED may also include signal lines (such as a data line, a common line), a touch electrode, a capacitor electrode, a conductive pad and other components. In addition, the components of the same film layer as the source electrode ES and the drain electrode ED may be connected to the components of the same film layer as the gate electrode EG through the corresponding via to construct a required circuit.

The first wire 124A may be configured on the insulation layer 128C and is a component of the same film layer as the source electrode ES and the drain electrode ED. For example, the first wire 124A, the source electrode ES and the drain electrode ED may be three components formed by patterning a same conductive material layer. The first wire 124A may be electrically connected to the gate electrode EG, the source electrode ES, or a capacitive electrode, a touch electrode or any signal line that is not shown in the figure through a corresponding conductive component. The first wire 124A may be used to transmit a signal required by the active component 122, and may also be used to transmit signals required by functional components (if any in the device) such as a touch device, a sensing device, etc. In some embodiments, multiple active devices 122 arranged in an array may be disposed on the initial substrate 110', and the first wire 124A may be disposed on an outer side of the active devices 122. In other words, when multiple active devices 122 are disposed on the initial substrate 110', all of the active devices 122 are located on a same side of the first wire 124A. In addition, although only one first wire 124A is shown in the figure, in fact, the number of the first wires 124A may be plural to establish different signal transmission paths.

The insulation layer 128D is configured on the first wire 124A, the source electrode ES and the drain electrode ED, and covers the first wire 124A, the source electrode ES and the drain electrode ED. The insulation layer 128D may have a relatively thick thickness, i.e., thicker than the insulation layers 128A to 128C, thereby providing a planarization effect. Therefore, the insulation layer 128D may be interpreted as a planarization layer. However, the disclosure is not limited thereto. In addition, the insulation layer 128E covers the insulation layer 128D. In some embodiments, the material of the insulation layers 128A to 128C and 128E may include inorganic insulation materials, such as silicon oxide, silicon nitride, silicon oxynitride, titanium oxide, aluminum oxide, and/or other inorganic insulation materials that may be applied to thin-film transistor manufacturing technology. The insulation layer 128D may be made of an organic insulation material, but the disclosure is not limited thereto. The applicable organic insulation materials may include a resin material, a photoresist material, polyimide (PI), polyethylene terephthalate (PET), polymethyl methacrylate (PMMA), etc.

It may be seen from FIG. 1 that the active device 122 and the first wire 124A are located between the insulation layer 128D and the substrate 110, and the insulation layer 128D may be patterned to expose a part of the first wire 124A away from the active device 122. In other words, the insulation layer 128D does not completely cover the first wire 124A. In addition, the insulation layer 128E may cover the insulation layer 128D and cover the part of the first wire 124A that is not covered by the insulation layer 128D. In other words, a part of the first wire 124A is covered by the insulation layer 128D and the other part is covered by the insulation layer 128E. In addition, the insulation layer 128D may also expose the drain electrode ED, and although the insulation layer 128E covers a sidewall of the insulation layer 128D, it may partially expose the drain electrode ED.

The device bonding pads 126A are configured on the insulation layer 128E. The device bonding pads 126A may be disposed in pairs, and one of the pair of device bonding pads 126A may be connected to the drain electrode ED of the active device 122 and the other one may be connected to a corresponding signal line (such as a common line). The device bonding pads 126A may be used to bond corresponding components in subsequent steps. Each device bonding pad 126A may include a first conductive portion MP and a second conductive portion SP, and the second conductive portion SP may cover the first conductive portion MP. The second conductive portion SP may be a conductive portion that is less likely to be oxidized compared to the first conductive portion MP. For example, the first conductive portion MP may be made of a metal material, and the second conductive portion SP may be made of a conductive oxide, but the disclosure is not limited thereto.

Figure 2:
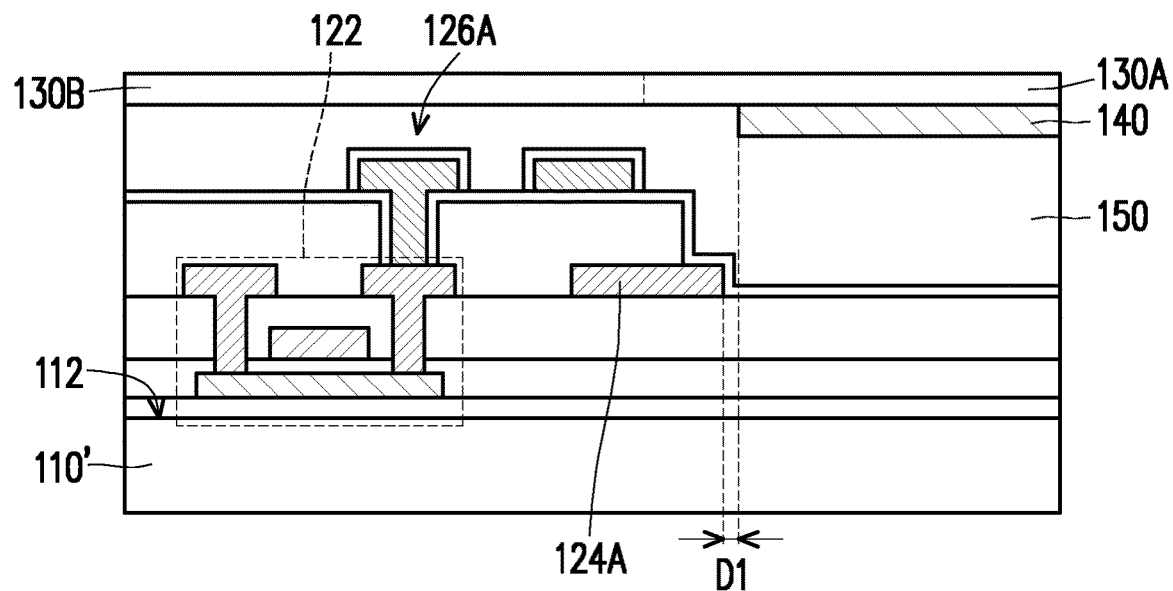

In FIG. 2, a vertical wire 140 is formed on a first part 130A of an initial film 130', and the initial film 130' is attached to the first surface 112 of the initial substrate 110', where a second part 130B of the initial film 130' may cover the active device 122 and the first wire 124A. The initial film 130' may be a thin film of an insulation material, which does not have conductive wires or similar elements inside. The vertical wire 140 may be fabricated on the initial film 130' in advance, and the initial film 130' is mainly attached to the initial substrate 110' in such a manner that the vertical wire 140 faces the initial substrate 110'. For example, the initial film 130' may be attached to the initial substrate 110' by an adhesive 150. The adhesive 150 provides a temporary adhesion effect, and in a subsequent step, the initial film 130' may be peeled/removed from the initial substrate 110'. In some embodiments, the adhesive 150 may be a thermal curing adhesive, but the disclosure is not limited thereto.

It may be seen from FIG. 2 that after the initial film 130' is attached to the initial substrate 110', the active device 122, the first wire 124A, the device bonding pad 126A, etc., are all covered by the initial film 130' and sandwiched between the initial film 130' and the initial substrate 110'. Therefore, the initial film 130' may shield all components on the first surface 112 of the initial substrate 110'. In some embodiments, an area of the initial film 130' on a plane formed by an X direction and a Y direction may be not smaller than that of the initial substrate 110'.

The vertical wire 140 is configured on a surface of the initial film 130' and is sandwiched between the initial film 130' and the adhesive 150. The initial film 130' is attached to the initial substrate 110' in a manner of displacing the vertical line 140 in the X direction by a lateral distance D1 relative to the first wire 124A. Namely, after the initial film 130' is attached to the initial substrate 110', an orthogonal projection of the vertical wire 140 on the initial substrate 110' may not be overlapped to an orthogonal projection of the first wire 124A on the initial substrate 110'. Moreover, the vertical wire 140 may be disposed corresponding to the first wire 124A. For example, an extension line of the orthogonal projection of the vertical wire 140 on the initial substrate 110' may be disposed on a same straight line as the orthogonal projection of the first wire 124A on the initial substrate 110'. In subsequent steps, the vertical wire 140 may be electrically connected to the first wire 124A to establish a connected electrical signal transmission path. In addition, multiple first wires 124A may be disposed on the initial substrate 110', and multiple vertical wires 140 may be disposed on the initial film 130', and the multiple first wires 124A and the multiple vertical wires 140 may be disposed in a one-to-one corresponding manner to form multiple independent electrical transmission paths.

Figure 3:
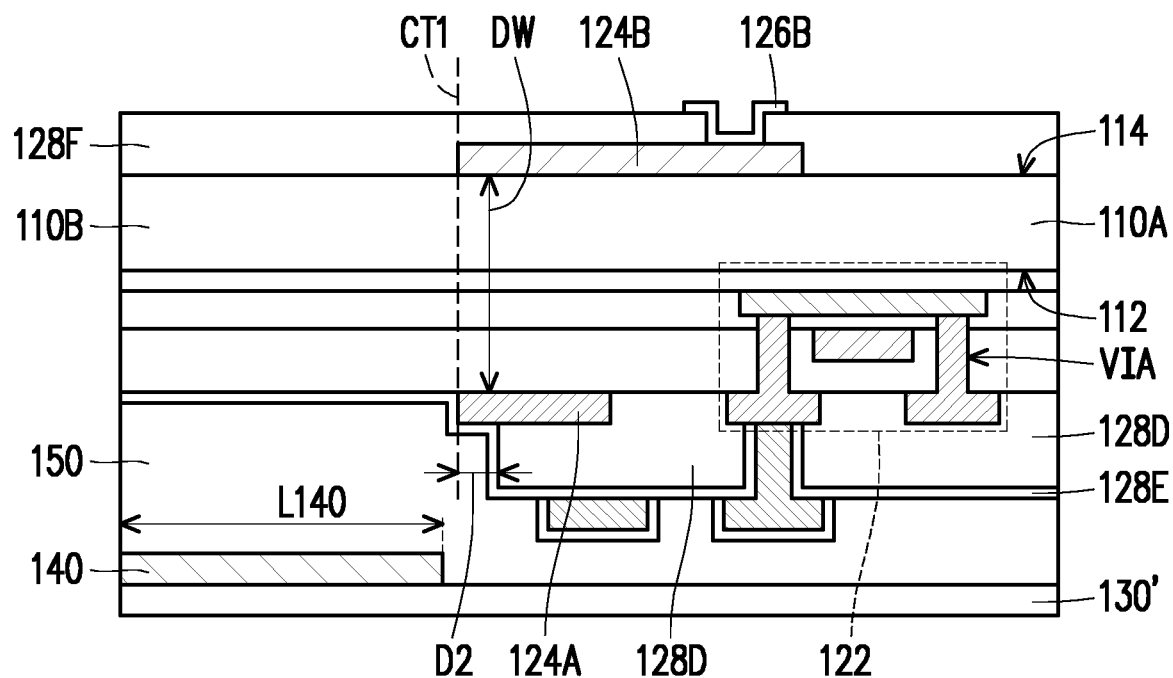

In FIG. 3, the structure of FIG. 2 is rotated along an axis parallel to the Y direction by 180 degrees, and the Z direction in FIG. 2 is turned to face downward. At this time, the initial film 130' is located under the initial substrate 110', and the second surface 114 of the initial substrate 110' is turned to face upward, where the first surface 112 and the second surface 114 are opposite surfaces of the initial substrate 110'. In addition, FIG. 3 illustrates a step of forming a second wire 124B on the second surface 114 of the initial substrate 110'. After the second wire 124B is formed, an insulation layer 128F may be further formed on the second surface 114 of the initial substrate 110'. The insulation layer 128F may cover the second wire 124B and partially expose the second wire 124B. In addition, FIG. 3 also shows a structure where a device bonding pad 126B is formed on the initial substrate 110'. The device bonding pad 126B is configured on the insulation layer 128F, and may be in contact with a part of the second wire 124B exposed by the insulation layer 128F, and is used for bonding with other devices.

During the process of fabricating the second wire 124B, the insulation layer 128F and the device bonding pad 126B, the active device 122, the first wire 124A, the vertical wire 140 and other components on the first surface 112 are covered by the initial film 130' without being exposed. Therefore, during the process of fabricating the second wire 124B, the insulation layer 128F, and the device bonding pad 126B, the active device 122, the first wire 124A, the vertical wire 140 and other components will not be damaged or changed, which helps to ensure integrity of the active device 122, the first wire 124A, the vertical wire 140, etc. In other words, the coverage of the initial film 130' helps to improve a manufacturing yield and maintain quality of the components.

In FIG. 3, the first wire 124A and the second wire 124B may be correspondingly disposed. For example, an orthogonal projection of the first wire 124A on the second surface 114 of the initial substrate 110' may be overlapped with an orthogonal projection of the second wire 124B on the second surface 114. Moreover, a pattern of the vertical wire 140 may also be designed corresponding to the first wire 124A and the second wire 124B. For example, a length L140 of the vertical wire 140 may not be less than a distance DW between the first wire 124A and the second wire 124B. In some embodiments, the orthogonal projection of the vertical wire 140 on the second surface 114 of the initial substrate 110', the orthogonal projection of the first wire 124A on the second surface 114, and the orthogonal projection of the second wire 124B on the second surface 114 may be disposed on a same straight line path.

Figure 4:
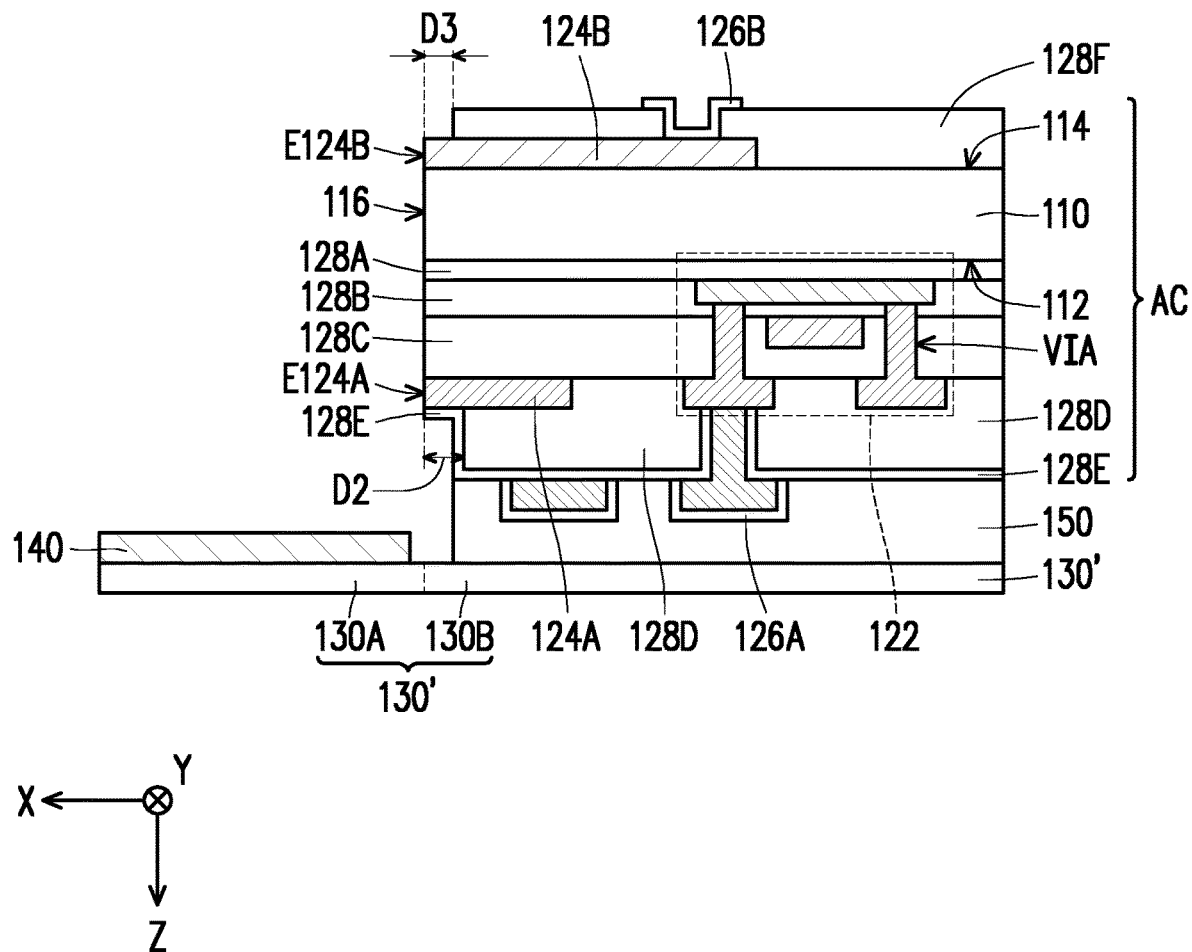

Then, the initial substrate 110' is cut along a cutting line CT1 in FIG. 3, where the cutting line CT1 divides the initial substrate 110' into a reserved part 110A and an excess part 110B, and the excess part 110B may be a part of the initial substrate 110' without the active device 122. Thereafter, as shown in FIG. 4, the excess part 110B of the initial substrate 110' is removed to form an active device substrate AC, and the vertical wire 140 on the first part 130A of the initial film 130' is exposed. According to FIG. 3, it is known that the cutting line CT1 may pass through the first wire 124A and the second wire 124B. Therefore, an end E124A of the first wire 124A and an end E124B of the second wire 124B may be exposed after the excess part 110B of the initial substrate 130' is removed. In some embodiments, the cutting line CT1 may not pass through the insulation layer 128D. For example, the cutting line CT1 and the insulation layer 128D may be separated by a lateral distance D2. In some embodiments, the lateral distance D2 may be 100 μm to 500 μm, such as 150 μm, 200 μm, 250 μm, etc.

In FIG. 4, the active device substrate AC includes the reduced substrate 110, the active device 122, the first wire 124A, a second wire 124B, the device bonding pad 126A, and the device bonding pad 126B. During the process of cutting the initial substrate 110' and removing the excess part 110B, a side surface 116 of the substrate 110 may be exposed, where the side surface 116 is a surface connected between the first surface 112 and the second surface 114, and a normal vector of the side surface 116 is different from that of the first surface 114 and also different from that of the second surface 114. Meanwhile, both of the first wire 124A and the second wire 124B may be exposed on the side surface 116. Namely, the end E124A of the first wire 124A and the end E124B of the second wire 124B may both be aligned with the side surface 116. In some embodiments, the end E124A of the first wire 124A and the end E124B of the second wire 124B may be selectively ground to help increasing an area of the end E124A and an area of the end E124B in a plane of Y-Z directions, but the disclosure is not limited thereto.

In FIG. 4, the insulation layers 128A to 128C and the insulation layer 128E may all be aligned with the side surface 116. An edge of the insulation layer 128D may be separated from the side surface 116 of the substrate 110 by a lateral distance D2, and the insulation layer 128E may continuously extend between a sidewall of the insulation layer 128D and the side surface 116 of the substrate 110. In addition, the insulation layer 128F may also be separated from the side surface 116 by a lateral distance D3, and the second wire 124B continuously extends between an edge of the insulation layer 128F and the side surface 116. In other embodiments, the insulation layer 128F may be selectively aligned with the side surface 116.

In the step of cutting the initial substrate 130' of FIG. 4, the initial film 130' and the vertical wire 140 on the initial film 130' remain intact. In other words, neither the initial film 130' nor the vertical wire 140 on the initial film 130' is cut or damaged. In addition, in the step of FIG. 4, a part of the adhesive 150 corresponding to the excess part 110B may be further removed to expose the first part 130A of the initial film 130' and the vertical wire 140 on the initial film 130'. The second part 130B of the initial film 130' is attached to the active device substrate AC through the remaining adhesive 150.

Figure 5:
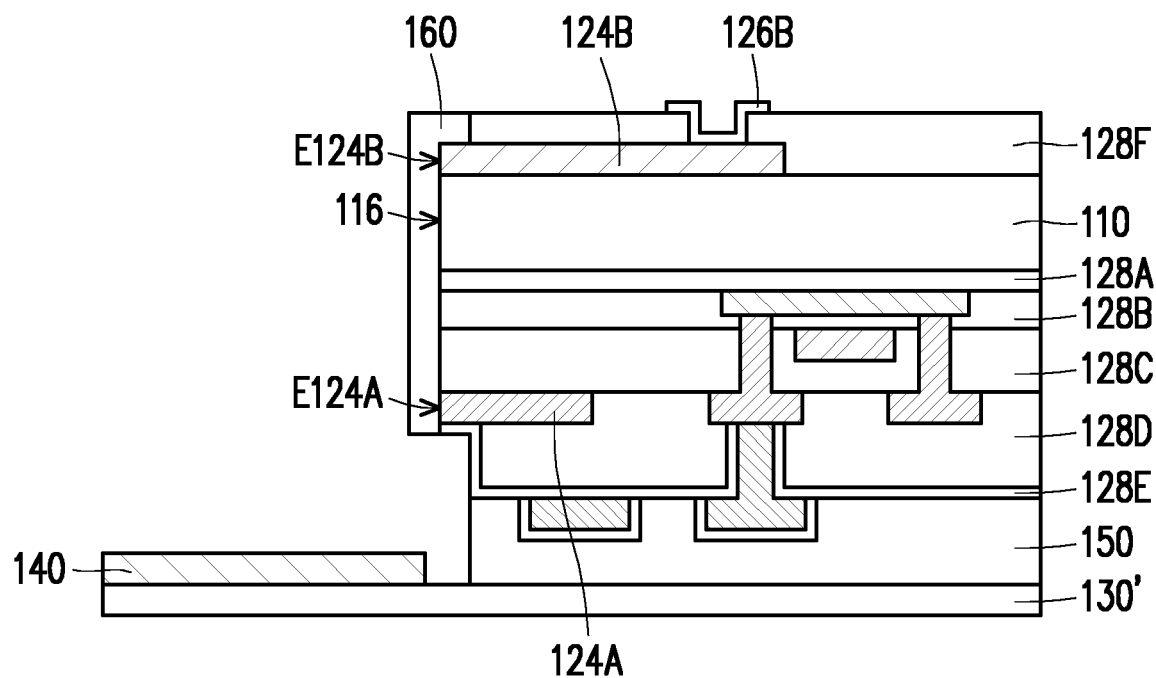

FIG. 5 shows a step of forming an anisotropic conductive adhesive 160 on the side surface 116 of the substrate 110. The anisotropic conductive adhesive 160 may be in contact with the side surface 116 of the substrate 110 and the insulation layers 128A to 128C and the insulation layer 128E that are aligned with the side surface 116. Meanwhile, the anisotropic conductive adhesive 160 is also in contact with the end E124A of the first wire 124A and the end E124B of the second wire 124B. In addition, the anisotropic conductive adhesive 160 may partially extend to be in contact with the insulation layer 128F contracted relative to the second wire 124B to cover the second wire 124B. In this way, a contact area between the anisotropic conductive adhesive 160 and the second wire 124B may be increased, which helps to improve the quality of conductive transmission.

Figure 6:
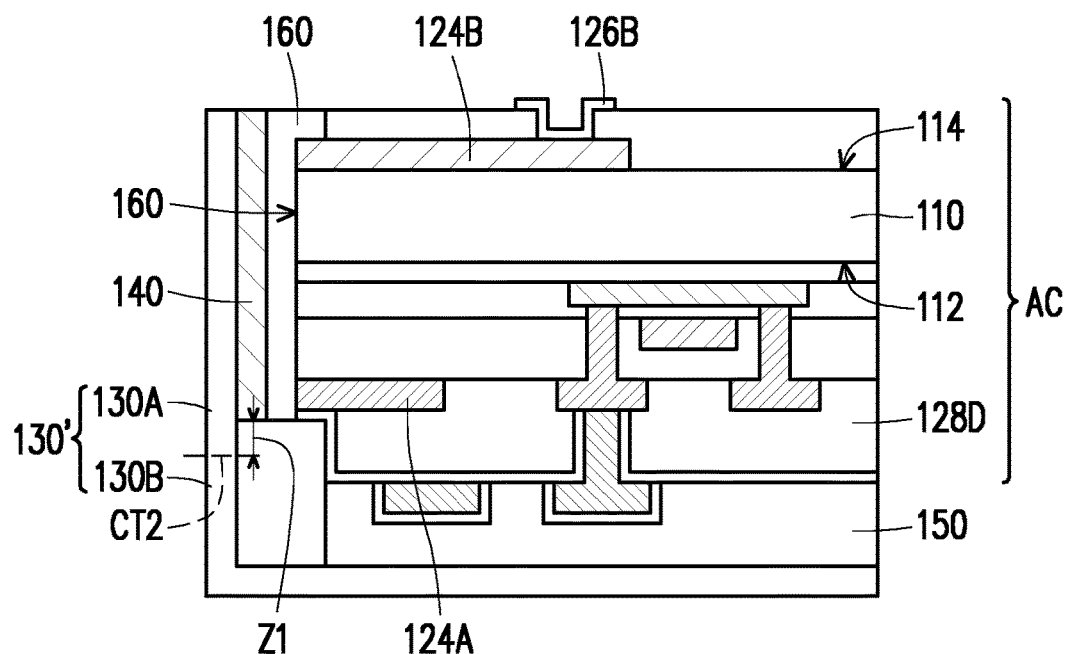

FIG. 6 shows a step of attaching the first part 130A of the initial film 130' to the active device substrate AC through the anisotropic conductive adhesive 160. To be specific, this step may include bending the initial film 130' and enabling the first part 130A of the initial film 130' to be in contact with the anisotropic conductive adhesive 160. In this way, the vertical wire 140 may be attached to the side surface 116 of the substrate 110 through the anisotropic conductive adhesive 160. The first part 130A of the initial film 130' is attached to the active device substrate AC through the anisotropic conductive adhesive 160 in a manner of aligning the vertical wire 140 with the first wire 124A and the second wire 124B. The anisotropic conductive adhesive 160 may physically be in contact with the first wire 124A, the second wire 124B, and the vertical wire 140, so that the first wire 124A, the second wire 124B, and the vertical wire 140 may be electrically connected to each other to form an electrical transmission path continuously extending from the first surface 112 of the substrate 110 to the second surface 114 through the side surface 116.

Figure 7:
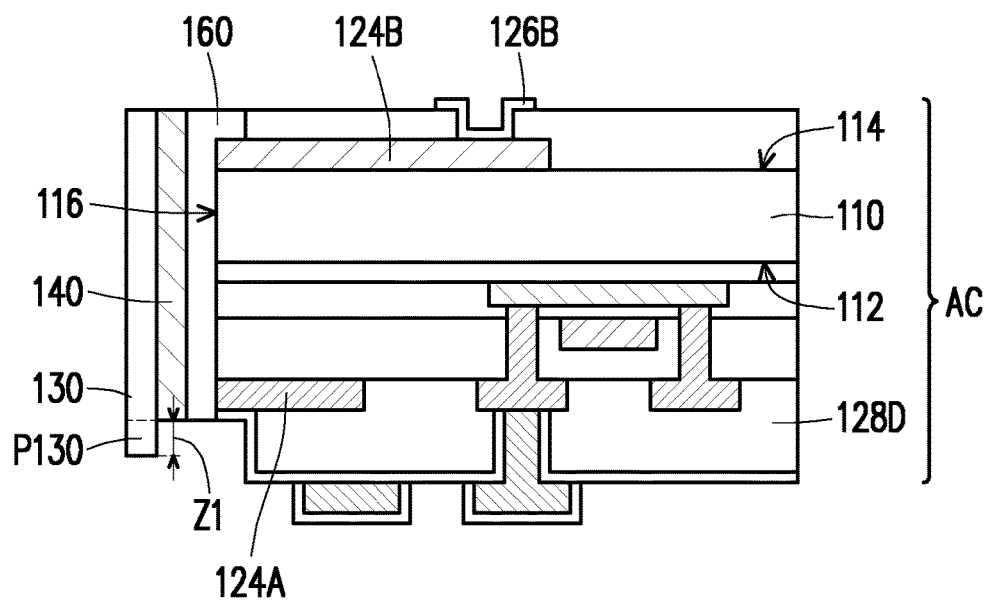

Then, the initial film 130' may be cut along a cutting line CT2 shown in FIG. 6 and the second part 130B of the initial film 130' may be removed, where the cutting line CT2 may be separated from the vertical wire 140 by a distance Z1 so that the cutting step will not damage the vertical wire 140. After the initial film 130' is cut along the cutting line CT2, the second part 130B and the corresponding adhesive 150 may be removed to obtain a structure shown in FIG. 7, in which the device bonding pad 126A may be exposed. In FIG. 7, the initial film 130' is cut into an insulation film 130 attached to the active device substrate AC, and the insulation film 130 may have a protrusion portion P130 protruding away from the vertical wire 140 from an end of the vertical wire 140. A protrusion height of the protrusion portion P130 is, for example, the aforementioned distance Z1 or less.

Figure 8:
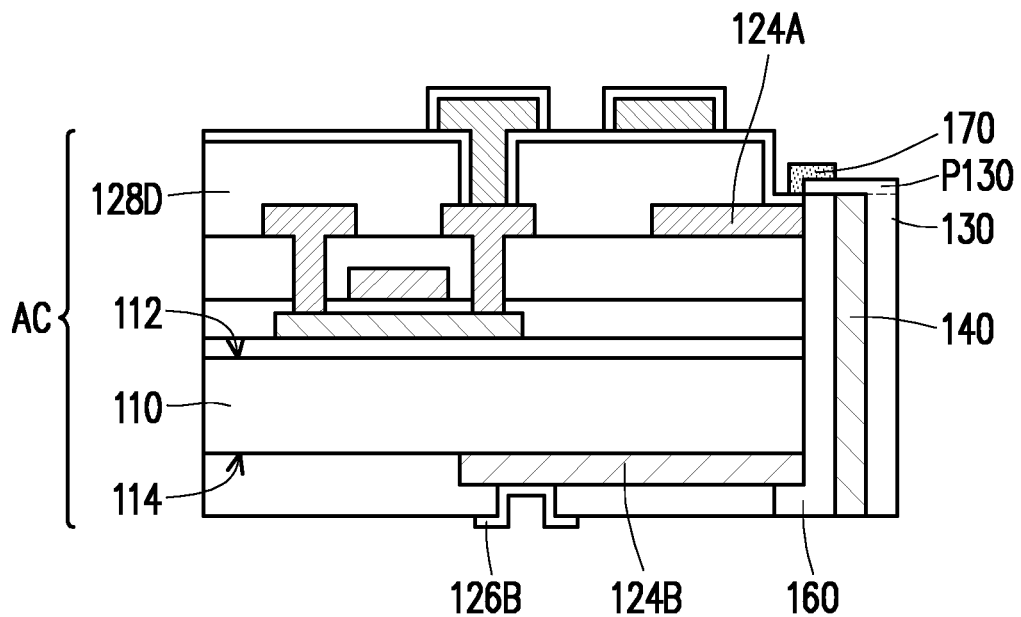
Figure 8:
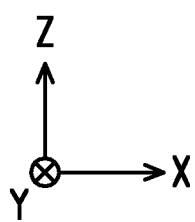

FIG. 8 shows a structure where the protrusion portion P130 of the insulation film 130 is bent. In FIG. 8, the protrusion portion P130 of the insulation film 130 may be bent to cover the end of the vertical wire 140, and may further cover the anisotropic conductive adhesive 160. A periphery of the bent protrusion portion P130 may be sealed and fixed by a sealing material 170. In this step, the sealing material 170 may be disposed along at least a part of the periphery of the insulation film 130 to fix and seal the periphery of the insulation film 130. The sealing material 170 is located between the insulation film 130 and the insulation layer 128D. The sealing material 170 may be a material having water and gas blocking characteristics. In some embodiments, the sealing material 170 may have light reflectivity, but the disclosure is not limited thereto. In FIG. 8, the sealing material 170 is configured on the periphery of the insulation film 130 adjacent to the first wire 124A, but the disclosure is not limited thereto. In other embodiments, the periphery of the insulation film 130 adjacent to the second wire 124B may also be sealed by the sealing material 170 and the sealing material 170 may cover and seal the end of the vertical wire 140 adjacent to the second wire 124B. In this way, in addition to the device bonding pad 126A and the device bonding pad 126B, other conductor members and conductor wires may all be sealed and without being exposed.

Figure 9:
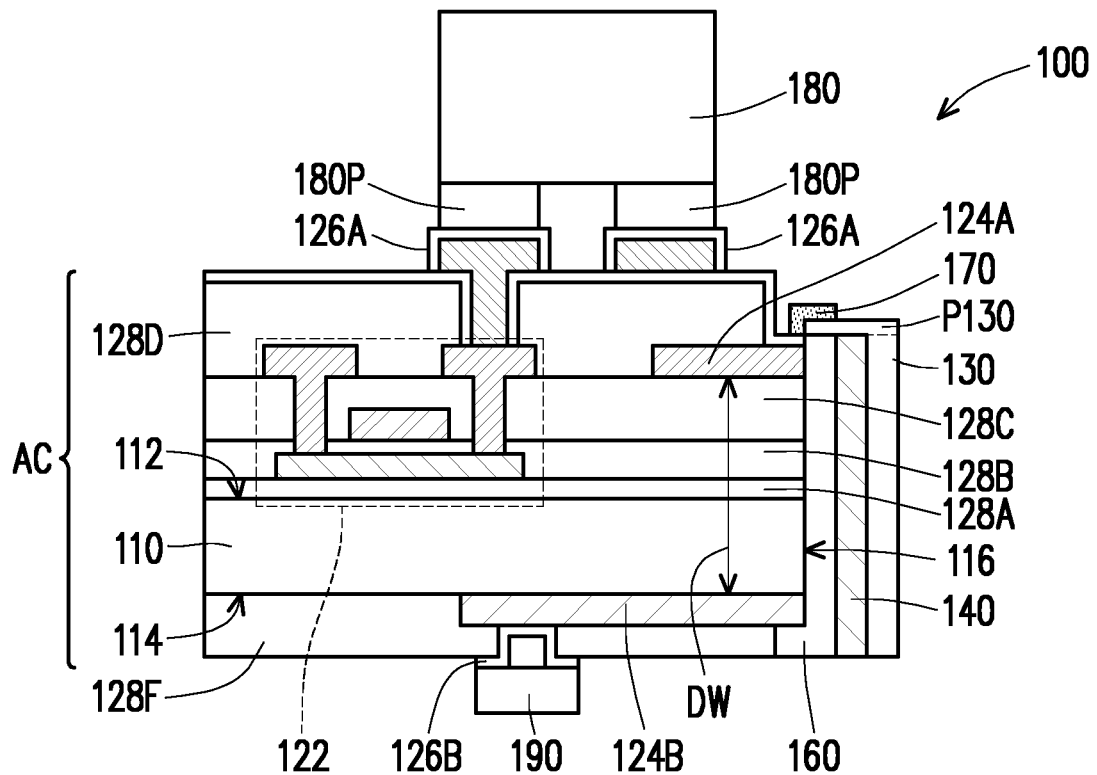
Figure 9:
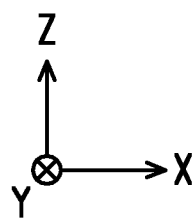

FIG. 9 shows a step of bonding an electronic element 180 and a driving circuit device 190 on the structure of FIG. 8 to form an electronic device 100. In FIG. 9, the electronic device 100 includes the active device substrate AC, the insulation film 130, the vertical wire 140, and the anisotropic conductive adhesive 160, where the active device substrate AC may include the substrate 110, the active device 122, the first wire 124A, the second wire 124B, the device bonding pad 126A, and the device bonding pad 126B. In addition, the electronic element 180 is bonded to the device bonding pad 126A of the active device substrate AC, and the driving circuit device 190 is bonded to the device bonding pad 126B of the active device substrate AC.

The substrate 110 has the first surface 112, the second surface 114, and the side surface 116. The first wire 124A is configured on the first surface 112 of the substrate 110, and the second wire 124B is configured on the second surface 114 of the substrate 110. In addition, the active device substrate AC further includes the active device 122 configured on the substrate 110 and a related signal line that is not shown. The first wire 124A may be electrically connected to the related signal line of the active device 122 to provide a transmission path for electrical signals.

The insulation film 130 is configured on the side surface 116 of the substrate 110. The insulation film 130 is, for example, a film with flexible properties, and a material of the insulation film 130 may be a plastic material, such as polyimide (PI) or other flexible materials. A size of the insulation film 130 in the Z direction may substantially correspond to the active device substrate AC. As shown in FIG. 9, the insulation film 130 may protrude more than the vertical wire 140, but the protrusion portion P130 of the insulation film 130 may be bent to cover the vertical wire 140. In some embodiments, an extending length of the insulation film 130 in the Z direction may not exceed a top surface of the insulation layer 128D or may not exceed a height of the device bonding pad 126A, which helps to make the electronic element 180 to be easily and stably bonded to the active device substrate AC. For example, when the insulation film 130 has a long extending length in the Z direction, a tool used for bonding the electronic element 180 may be probably blocked by the protruding insulation film 130 to affect the progress of the bonding step. However, the extending length of the insulation film 130 in the Z direction may not exceed the top surface of the insulation layer 128D or may not exceed the height of the device bonding pad 126A, so as to prevent the bonding step from being affected.

The vertical wire 140 is configured on the surface S130 of the insulation film 130 and located between the side surface 116 of the substrate 110 and the insulation film 130. The vertical wire 140 is not buried in the insulation film 130, but protrudes on a surface S130 of the insulation film 130. In some embodiments, the vertical wire 140 is a conductive wire, which is, for example, made of metal or other conductive materials. The vertical wire 140 is, for example, a linear conductor structure extending in the Z direction, and an extending length of the vertical wire 140 may be at least equal to a distance DW between the first wire 124A and the second wire 124B in the Z direction. An orthogonal projection of the vertical wire 140 on a plane where the side surface 116 is located may be overlapped with orthogonal projections of the first wire 124A and the second wire 124B on the plane where the side surface 116 is located. In other words, extending lines of the first wire 124A and the second wire 124B may pass through the vertical wire 140. The end of the vertical wire 140 may be covered by the protrusion portion P130 of the insulation film 130 without being exposed, which helps to prevent the vertical wire 140 from being oxidized or damaged.

The anisotropic conductive adhesive 160 is used to attach the insulation film 130 to the active device substrate AC. As shown in FIG. 9, the anisotropic conductive adhesive 160 is in contact with the insulation layer 128E, the first wire 126A, the insulation layers 128A to 128C, and the second wire 124B that are substantially aligned with the side surface 116. In addition, the anisotropic conductive adhesive 160 also extends toward the insulation layer 128F near the end of the second wire 124B to wrap the second wire 124B. A part of the anisotropic conductive adhesive 160 is configured between the vertical wire 140 and the side surface 116 of the substrate 110, and electrically connects the vertical wire 140 to the first wire 124A and the second wire 124B. In this way, the vertical wire 140, the first wire 124A, and the second wire 124B may form an electrical transmission path that continuously extends from the first surface 112 of the substrate 110 to the second surface 114 through the side surface 116 based on conductive directivity of the anisotropic conductive adhesive 160.

The sealing material 170 may be configured on the first surface 112 of the substrate 110 and configured along the periphery of the insulation film 130. A material of the sealing material 170 has water-gas blocking properties and helps to reduce the possibility of deterioration, oxidation, or conductivity reduction of the vertical wire 140 due to moisture. In some embodiments, the sealing material 170 may have a light reflecting property to help improving an optical effect of the electronic device 100.

In some embodiments, the electronic element 180 is bonded to the device bonding pad 126A located on the first surface 112. The electronic element 180 is, for example, a light-emitting diode (LED), where the LED may be a horizontal LED, a vertical LED, or other types of LEDs according to different structural designs. In some embodiments, the LED may be a milli LED, a mini LED, or a micro LED according to a structure size. In some embodiments, when the sealing material 170 has light reflectivity, the sealing material 170 may reflect light emitted by the electronic element 180 to improve light utilization efficiency of the electronic element 180. In addition, the electronic element 180 may include two pads 180P, and the two pads 180P are respectively connected to different device bonding pads 126A. In some embodiments, when the electronic element 180 is an LED, the two pads 180P may be an anode pad and a cathode pad, respectively.

The driving circuit 190 is bonded to the device bonding pad 126B located on the second surface 114. The driving circuit 190 includes, for example, a flexible circuit board, a driving chip or a combination thereof. The driving circuit 190 may be used to provide electrical signals required by the electronic element 180. The signal provided by the driving circuit 190 may be transmitted to the second wire 124B through the device bonding pad 126B, and transmitted to the first wire 124A located on the first surface 112 through the electrical transmission path constructed by the second wire 124B, the anisotropic conductive adhesive 160, the vertical wire 140 and the first wire 124A. The first wire 124A may further transmit the electrical signal to the corresponding device (such as the corresponding signal line or electrode) configured on the first surface 112. In this way, the active device substrate AC does not need to reserve an area required for bonding the driving circuit 190 on the side of the first surface 112, so as to achieve a design of narrow frame.

In some embodiments, due to the design of narrow frame, a configuration position of the electronic element 180 is not limited and may be placed on the periphery of the active device substrate AC, adjacent to the edge of the electronic device 100. In this way, the electronic device 100 may have a substantially frameless structural design. Such electronic device 100 may improve a splicing effect of multiple devices when being applied to products such as spliced displays, and users are not easy to perceive splicing seams, which helps to improve image continuity of the spliced display. As shown in the manufacturing steps described in FIG. 1 to FIG. 9, during the manufacturing process of the electronic device 100, the components and wires on the first surface 112 may be covered with the initial film 130' to avoid being damaged in the manufacturing process of the second wire 124B. Therefore, the manufacturing steps described in FIG. 1 to FIG. 9 help to improve the manufacturing yield of the electronic device 100.

Figure 10:
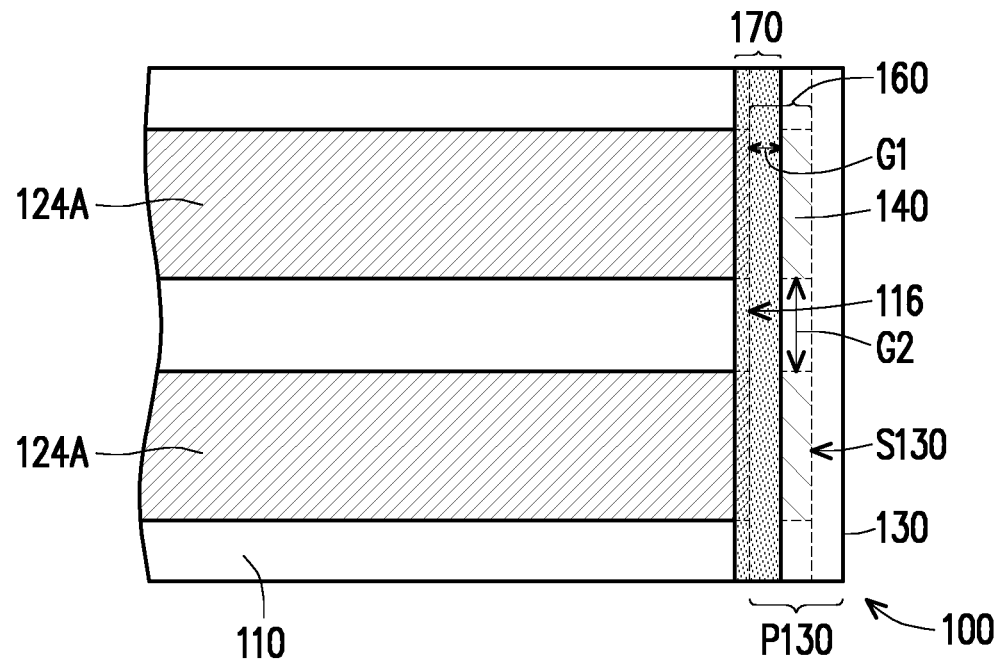
FIG. 10 is a schematic top view of an electronic device 100 when viewing a first wire 124A in a Z direction.
Figure 10:
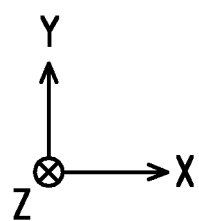

FIG. 10 is a schematic top view of the electronic device 100 when viewing the first wire 124A in the Z direction. In order to simplify the drawing to present a configuration relationship of the components, FIG. 10 only shows the substrate 110, the first wire 124A, the insulation film 130, the vertical wire 140, the anisotropic conductive adhesive 160 and the sealing material 170. It may be seen from FIG. 10 that the protrusion portion P130 of the insulation film 130 may cover the end of the vertical wire 140, and the sealing material 170 may be configured along the periphery of the insulation film 130. FIG. 10 shows two first wires 124A, which are, for example, used to transmit different electrical signals. It may be seen from FIG. 10 that the number of vertical wires 140 may correspond to the number of first wires 124A, and each vertical wire 140 may be disposed corresponding to one of the first wires 124A, thereby constructing multiple electrical transmission paths.

The anisotropic conductive adhesive 160 is configured between the insulation film 130 and the substrate 110. The anisotropic conductive adhesive 160 not only is contact with the vertical wire 140, but is also in contact with a part of the insulation film 130 where the vertical wire 140 is not disposed. Namely, the anisotropic conductive adhesive 160 may be continuously distributed between adjacent vertical wires 140 without being patterned. In the embodiment, a gap G1 between each vertical wire 140 and the corresponding first wire 124A is smaller than a gap G2 between the adjacent vertical wires 140. Since the anisotropic conductive adhesive 160 has the characteristic of conducting along the shortest path, although the anisotropic conductive adhesive 160 is continuously distributed between the adjacent vertical wires 140, it does not cause the adjacent vertical wires 140 to be electrically conducted to each other. In other words, under the continuous disposition of the anisotropic conductive adhesive 160, each vertical wire 140 may be electrically conducted to the corresponding first wire 124A without being electrically conducted to the adjacent vertical wire 140, thereby forming a required electrical transmission path. For example, each first wire 124A is electrically connected to a corresponding vertical wire 140.

Figure 11:
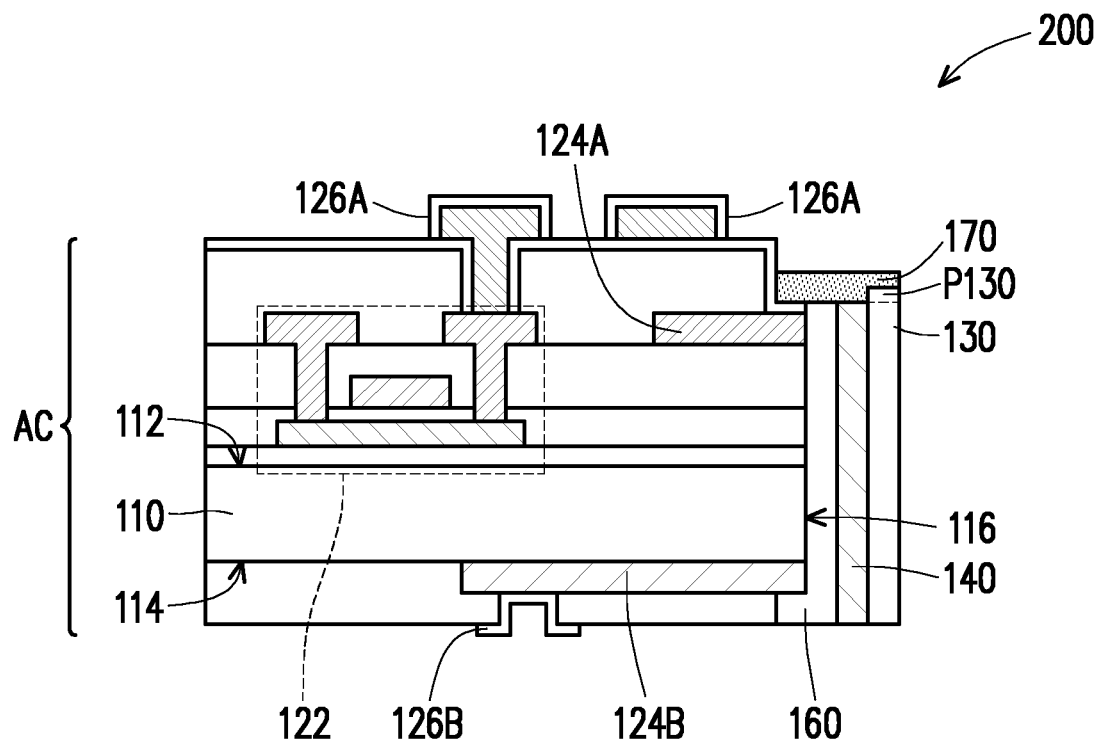
FIG. 11 is a schematic partial cross-sectional view of an electronic device according to another embodiment of the disclosure.

FIG. 11 is a schematic partial cross-sectional view of an electronic device according to another embodiment of the disclosure. An electronic device 200 in FIG. 11 is substantially similar to the electronic device 100 in FIG. 9, but the electronic element 180 and the driving circuit device 190 are omitted in FIG. 11. To be specific, the electronic device 200 includes the active device substrate AC, an insulation film 130, the vertical wire 140, the anisotropic conductive adhesive 160, and the sealing material 170, and the manufacturing methods and disposition relationship of these components may be deduced by referring to the description of the above embodiment, which are not repeated. The difference from the electronic device 100 is that the insulation film 130 in the electronic device 200 is not bent, so that the protrusion portion P130 of the insulation film 130 may extend beyond the vertical wire 140 in the Z direction. In addition, as shown in FIG. 11, the sealing material 170 may cover the end of the vertical wire 140 and be sandwiched between the insulation film 130 and the active device substrate AC. The sealing material 170 may also optionally cover the periphery of the protrusion portion P130 of the insulation film 130. To be specific, according to the embodiment and the embodiment of FIG. 9, it is known that one of the insulation film 130 and the sealing material 170 may cover or even be in direct contact with the end of the vertical wire 140. In some embodiments, the insulation film 130 and the sealing material 170 may respectively be in contact with a part of the end of the vertical wire 140 to completely cover the end of the vertical wire 140.

Figure 12:
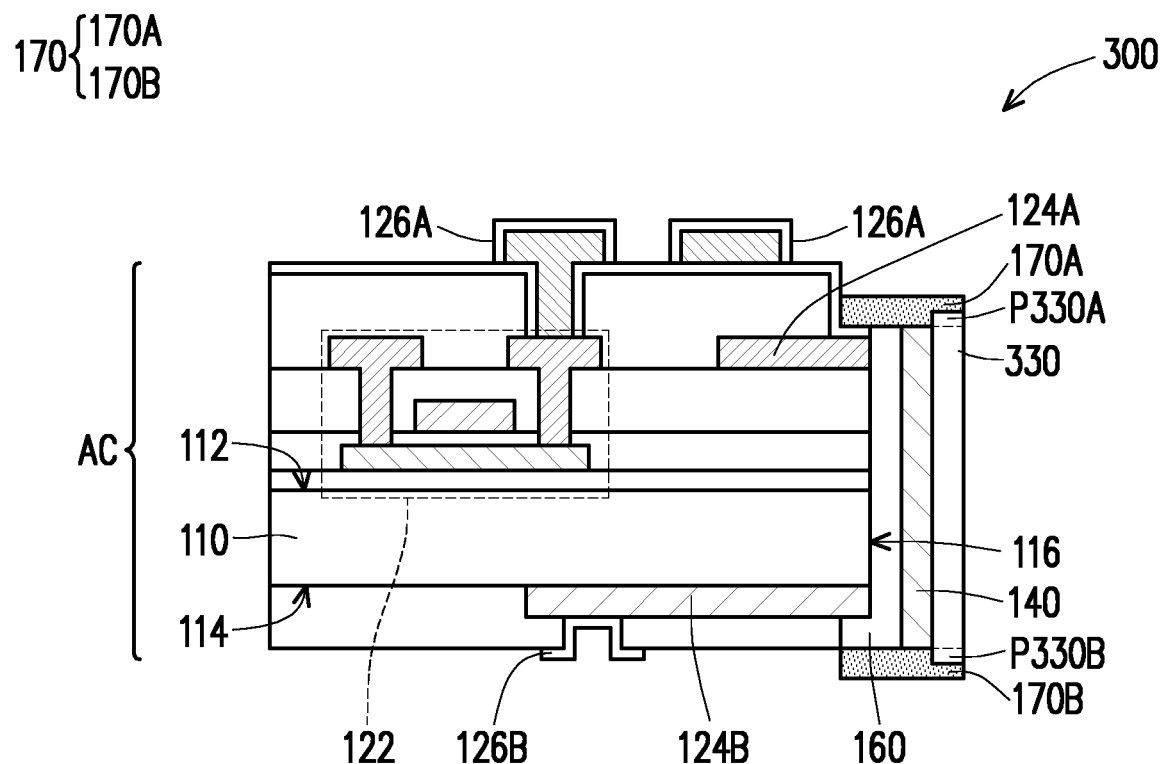
FIG. 12 is a schematic partial cross-sectional view of an electronic device according to still another embodiment of the disclosure.
Figure 12:
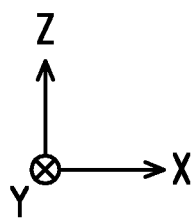

FIG. 12 is a schematic partial cross-sectional view of an electronic device according to still another embodiment of the disclosure. An electronic device 300 of FIG. 12 is substantially similar to the electronic device 100 of FIG. 9, but the electronic element 180 and the driving circuit device 190 are omitted in FIG. 12. To be specific, the electronic device 300 includes the active device substrate AC, an insulation film 330, the vertical wire 140, the anisotropic conductive adhesive 160, and the sealing material 170, and the manufacturing methods and disposition relationship of these components may be deduced by referring to the description of the above embodiment, which are not repeated. The difference from the electronic device 100 is that the insulation film 330 of the electronic device 300 may extend beyond the two ends of the vertical wire 140 in the Z direction. The material and the manufacturing method of the insulation film 330 may be the same as that of the aforementioned insulation film 130, but only the structure design is slightly different from that of the insulation film 130.

For example, the insulation film 330 of the embodiment may include a protrusion portion P330A and a protrusion portion P330B, where the protrusion portion P330A protrudes away from the vertical wire 140 from the end of the vertical wire 140 adjacent to the first surface 112 in the Z direction, and the protrusion portion P330B protrudes away from the vertical line 140 from the end of the vertical line 140 adjacent to the second surface 114 in the Z direction. The sealing material 170 may include a first sealing material 170A and a second sealing material 170B, where the first sealing material 170A and the second sealing material 170B may respectively be in direct contact with the two opposite ends of the vertical wire 140 to seal the vertical wire 140. The first sealing material 170A is configured between the protrusion portion P330A and the active device substrate AC, and the second sealing material 170B is configured between the protrusion portion P330B and the active device substrate AC.

Figure 13:
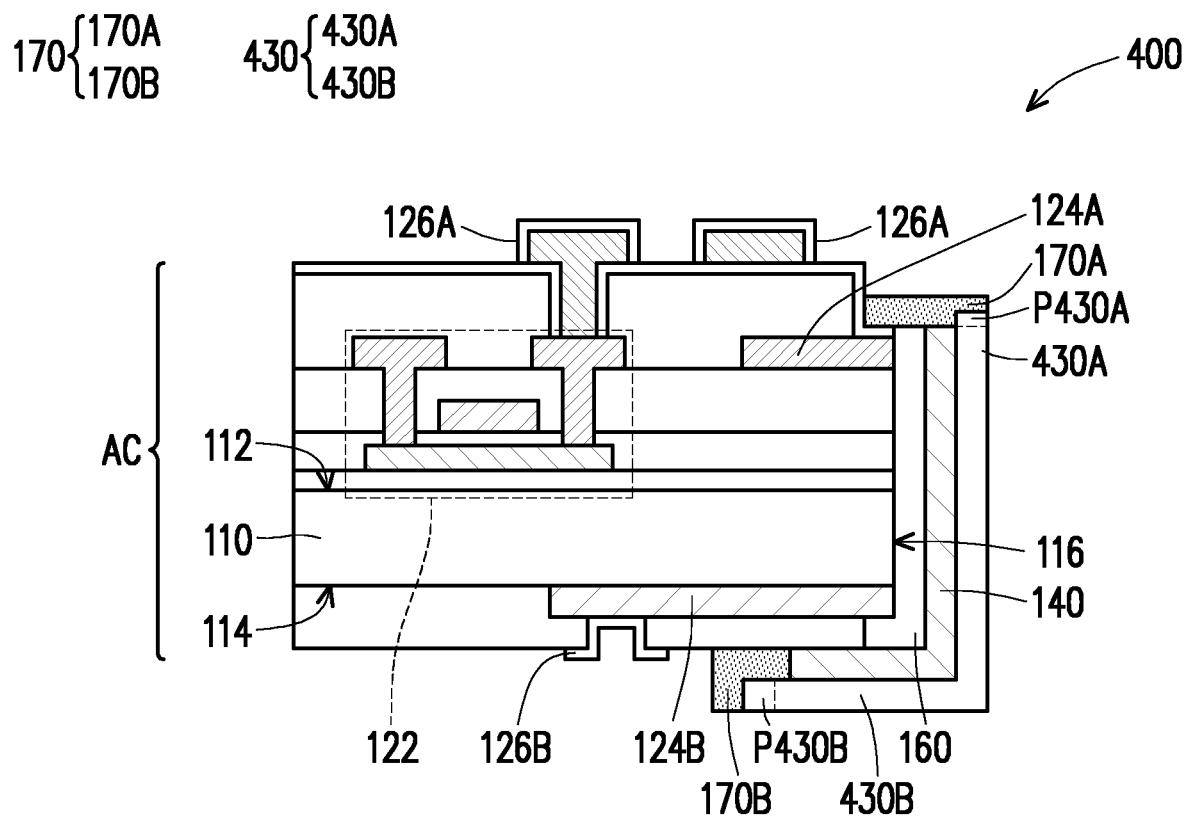
FIG. 13 is a schematic partial cross-sectional view of an electronic device according to yet another embodiment of the disclosure.

FIG. 13 is a schematic partial cross-sectional view of an electronic device according to yet another embodiment of the disclosure. An electronic device 400 of FIG. 13 is substantially similar to the electronic device 100 of FIG. 9, but the electronic element 180 and the driving circuit device 190 are omitted in FIG. 13. To be specific, the electronic device 400 includes the active device substrate AC, an insulation film 430, the vertical wire 140, the anisotropic conductive adhesive 160, and the sealing material 170, and the manufacturing methods and disposition relationship of the active device substrate AC, an insulation film 430, the vertical wire 140, the anisotropic conductive adhesive 160, and the sealing material 170 may be deduced by referring to the description of the embodiment of FIG. 9, which are not repeated. A main difference between the embodiment and the electronic device 100 of FIG. 9 lies in a design of the insulation film 420. Therefore, the electronic device 400 may be regarded as an embodiment in which the design of the insulation film 430 is used to replace the insulation film 130 of the electronic device 100.

In the embodiment, the active device substrate AC may at least include the substrate 110, the active device 122, the first wire 124A, the second wire 124B, the device bonding pad 126A, the device bonding pad 126B, and multilayer insulation layers (such as the insulation layers 124A to 128F described in the previous embodiment). The substrate 110 has the first surface 112, the second surface 114, and the side surface 116 connected between the first surface 112 and the second surface 114. The active device 122 and the first wire 124A are configured on the first surface 112 of the substrate 110, and the second wire 124B is configured on the second surface 114 of the substrate 110. The device bonding pad 126A may be configured on the first surface 112 of the substrate 110 and is at least partially electrically connected to the active device 122. The device bonding pad 126B may be configured on the second surface 114 of the substrate 110 and electrically connected to the second wire 124B.

In FIG. 13, besides that the insulation film 430 is attached to the active device substrate AC along the plane of the side surface 116 of the substrate 110, it is also partially attached to the active device substrate AC along the plane of the second surface 114 of the substrate 110. In other words, a first part 430A of the insulation film 430 is substantially disposed along a plane of the Y-Z directions, and a second part 430B is substantially disposed along a plane of the X-Y directions. In this way, the insulation film 430 is, for example, bent to have an L-shaped cross-sectional structure, as shown in FIG. 13.

The sealing material 170 may be configured along the periphery of the insulation film 430 in the embodiment. The insulation film 430 may have a protrusion portion P430A and a protrusion portion P430B protruding from the vertical wire 140. The protrusion portion P430A is located at the edge of the first part 430A, and the protrusion portion P430B is located at the edge of the second part 430B. The sealing material 170 may include a first sealing material 170A and a second sealing material 170B, where the first sealing material 170A and the second sealing material 170B are respectively configured along the protrusion portion P430A and the protrusion portion P430B. In addition, the first sealing material 170A and the second sealing material 170B may optionally be in contact with the opposite ends of the vertical wire 140.

In summary, the electronic device of the embodiment of the disclosure uses the anisotropic conductive adhesive to attach the vertical wire fabricated on the insulation film to the active device substrate to establish a vertical electrical transmission path. Therefore, the electronic device may bond the driving circuit device and the functional device (such as a light-emitting device, a display device, etc.) on two opposite surfaces of the active device substrate, so that the functional device may be disposed as close as possible to the edge of the electronic device. In this way, the electronic device may have a narrow frame design to meet various application requirements. In addition, when the electronic device is manufactured, it is required to fabricate wires on two opposite surfaces of the active device substrate. The insulation film disposed with vertical wire may be used to protect the active device wires on the first surface of the active device substrate to prevent the wires and devices that have been made on the first surface from being damaged during the process of fabricating wires on the second surface. In this way, in addition to supporting and covering the vertical wire in the electronic device, the insulation film may also provide protection to improve the manufacturing yield of the electronic device.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. An electronic device, comprising:
   an active device substrate, comprising a substrate, a first wire, and a second wire, wherein the first wire is configured on a first surface of the substrate, the second wire is configured on a second surface of the substrate, and the first surface and the second surface are opposite to each other while a side surface of the substrate connects the first surface to the second surface;
   an insulation film, configured on the side surface of the substrate;
   a vertical wire, configured on a surface of the insulation film and located between the insulation film and the side surface of the substrate; and
   an anisotropic conductive adhesive, configured between the vertical wire and the side surface of the substrate, and electrically connects the vertical wire to the first wire and the second wire.

2. The electronic device according to claim 1, wherein the insulation film has a protrusion portion, and the protrusion portion protrudes away from the vertical wire from an end of the vertical wire.

3. The electronic device according to claim 2, wherein the protrusion portion is bent to cover the end of the vertical wire.

4. The electronic device according to claim 1, further comprising:
   a sealing material, configured on the active device substrate and disposed along at least a part of a periphery of the insulation film.

5. The electronic device according to claim 4, wherein one of the insulation film and the sealing material covers an end of the vertical wire.

6. The electronic device according to claim 1, wherein the active device substrate further comprises an insulation layer, the first wire is located between the insulation layer and the substrate, and an edge of the insulation layer is separated from the side surface by a lateral distance.

7. The electronic device according to claim 1, wherein an end of the first wire is aligned with the side surface.

8. The electronic device according to claim 1, wherein an end of the second wire is aligned with the side surface.

9. The electronic device according to claim 1, wherein the anisotropic conductive adhesive is in contact with an end of the first wire and an end of the second wire.

* * * * *